US006292370B1

(12) United States Patent
Anderson et al.

(10) Patent No.: US 6,292,370 B1
(45) Date of Patent: Sep. 18, 2001

(54) FLEXIBLE CIRCUIT BOARD AND METHOD FOR MAKING A FLEXIBLE CIRCUIT BOARD

(75) Inventors: David J. Anderson, Oak Lawn; Tomasz L. Klosowiak, Glenview, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/410,700

(22) Filed: Oct. 1, 1999

(51) Int. Cl.[7] .................................. H05K 1/02; H05K 1/03
(52) U.S. Cl. ........................ 361/748; 361/749; 361/752; 174/254; 174/256; 174/258; 29/830; 29/846
(58) Field of Search ...................................... 361/748–751, 361/752; 174/254, 258, 256; 439/67, 77, 493, 76.1; 29/829–831, 846

(56) References Cited

U.S. PATENT DOCUMENTS

| | | | |
|---|---|---|---|
| 3,341,742 | * 9/1967 | Klehm, Jr. ............................ 361/749 |
| 4,913,955 | * 4/1990 | Noda et al. ............................ 174/254 |
| 4,958,260 | * 9/1990 | Kobayashi et al. ................... 361/749 |
| 5,008,496 | * 4/1991 | Schmidt et al. ...................... 361/749 |
| 5,121,297 | * 6/1992 | Haas ..................................... 361/751 |
| 5,144,534 | * 9/1992 | Kober ................................... 361/751 |
| 5,170,326 | * 12/1992 | Meny et al. .......................... 361/749 |
| 5,428,190 | * 6/1995 | Stopperan ............................. 174/254 |
| 5,434,362 | * 7/1995 | Klosowiak et al. ................. 174/254 |
| 5,903,440 | * 5/1999 | Blazier et al. ........................ 361/749 |
| 5,963,427 | * 10/1999 | Bollesen ............................... 361/749 |

* cited by examiner

Primary Examiner—Jayprakash N. Gandhi
Assistant Examiner—John B. Vigushin
(74) Attorney, Agent, or Firm—Kenneth D. Labudda

(57) ABSTRACT

A flexible circuit board and a method for making a flexible circuit board. The flexible circuit board (10) is formed from a substantially rigid material and includes a first portion (12) and a second portion (14) coupled by a bend region (16). The bend region (16) includes at least one bend (40, 52) having a radius less than 120 mils.

17 Claims, 2 Drawing Sheets

FLEXIBLE CIRCUIT BOARD AND METHOD FOR MAKING A FLEXIBLE CIRCUIT BOARD

FIELD OF THE INVENTION

The present invention relates generally to flexible circuits, and more particularly, the present invention relates to a flexible circuit board and a method for making a flexible circuit board.

BACKGROUND OF THE INVENTION

Electronic circuits operate as the result of the interconnection and interaction of numerous electronic components. Typically, the various electronic components are interconnected using a circuit board.

Rigid printed circuit board technology is very well known. On a substrate, conductive traces are formed based upon a predetermined pattern. At certain locations on the circuit board, conductive pads are formed that couple to the conductive traces. The conductive pads define locations on the circuit board to which electronic components are electrically coupled, for example, by soldering. With all of the required electronic components secured to the circuit board, the conductive traces interconnect the electronic components so that the circuit board becomes operable to perform one or many functions for which it was designed.

A material that is well known in the construction of circuit boards is a type of epoxy glass known as FR4. A typical circuit board will have numerous laminated layers of epoxy glass to provide a relatively stiff, and structurally stable substrate onto which the conductive traces and pads may be formed and to which the electronic components may be secured.

Some circuit applications require the circuit board to be flexible. In some flexible circuit applications, a portion of the circuit board may flex during normal operation of the device to which it is associated. For example, in some applications mechanical components to which the circuits are fixed are required to move relative to each other during normal operation. If numerous interconnections are required between the circuit elements coupled to the respective mechanical components a wired interconnection may not be practical. Advantageously, a flexible circuit board may be used with the interconnections being formed as conductive traces on the flexible circuit board.

The FR4 material has not been suitable for use in flexible circuits. As described above, the FR4 material is typically a construction of numerous (for example, between about 2–5 layers) layers of glass weaves within an epoxy resin. Individually and/or collectively, once the epoxy resin is cured, the layers are stiff. A substitute material that has been successfully used to form flexible circuits is polyimide. Polyimide, however, is substantially more expensive than FR4.

A particularly useful application for flexible circuit boards is in three-dimensional (3D) packaging. In a 3D packaging application, a planar circuit board is laid out and the circuit elements are secured to the circuit board in this planar form. The planar board is then folded one or more times to facilitate packaging of the circuit within a housing and to reduce the volume occupied by the circuit package. Constructing the circuit in a planar form simplifies and facilitates manufacturing using automation. The ability to then fold the circuit board into a more compact volume is a great advantage to the packaging designer, and particularly to the automotive electronic packaging designer, who is frequently faced with space constraints. However, such folding does require at least a portion of the circuit board where it is to be folded to be flexible.

Unlike applications where the circuit board must flex repeatedly during normal operation, flexible circuit boards in 3D packaging applications may be considered "static flexible." That is, the circuit board needs to flex only once when manufactured and folded into its final configuration. Although the circuit board is only required to flex once, it may require forming a bend in the circuit board of relatively small radius, e.g., less than 120 mils. These bending requirements again limit construction of the circuit boards to very flexible materials, i.e., polyimide, because typical FR4 materials are again too brittle to form bends of such small radius. Forming bends in FR4 material of radius less than about 200 mils typically results in cracking of the circuit board, which is an unacceptable defect.

It would be desirable and advantageous to form a flexible circuit board for a 3D packaging application using less expensive materials, such as FR4, without the associated limitations on the ability to form bends in the circuit board.

DETAILED DESCRIPTION OF THE PREFERRED EMBODIMENTS

Figures 1, 2, 3:
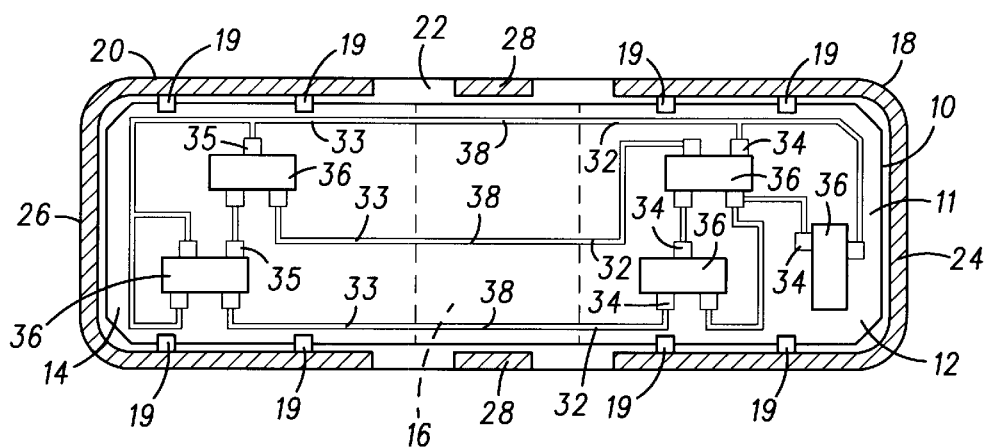
FIG. 1 is a plan view of an electronic device in a planar state with the electronic device incorporating a flexible circuit board in accordance with a preferred embodiment of the invention.
FIG. 2 is a perspective view of the electronic device shown in FIG. 1 in a finished assembled state.
FIG. 3 is a cross-section view taken along line 3—3 of FIG. 2.

Referring now to FIG. 1, a flexible circuit board 10 includes a substrate 11 having a first portion 12, a second portion 14 and a bend region 16 joining the first portion 12 and the second portion 14. The first portion 12 and the second portion 14 of the substrate may be multiple layers of FR4, while the bend region 16 is preferably formed from a single layer of FR4 material, that is, a single glass weave impregnated with resin. The bend region 16 may, however, include multiple layers of FR4 material laminated together, but generally will have only a single layer.

The first portion 12 and the second portion 14 may be secured within a first housing member 18 and a second housing member 20, respectively. The first portion 12 and the second portion 14 may be bonded, staked or, as shown in FIG. 1, retained by tab members 19 formed within the first housing member 18 and the second housing member 20. The first housing member 18 and the second housing member 20 are connected by a connecting member 22, and in a preferred embodiment, the first housing member 18, the second housing member 20 and the connecting member 22 are formed integrally from a metal, such as aluminum. The first housing member 18, the second housing member 20 and the connecting member 22 may each include flange members 24, 26 and 28, respectively. With reference to FIG. 2, in a finished configuration, the first housing member 18, the second housing member, the connecting member 22, and the flanges 24–28 form an enclosed housing structure 30 containing the flexible circuit board 10. The interfaces 29 between the flanges 24–28 may be welded or sealed using a suitable sealing material 31 (FIG. 3).

Referring once again to FIG. 1, a plurality of conductive traces 32 and conductive pads 34 are formed on the first portion 12, and a plurality of conductive traces 33 and conductive pads 35 are formed on the second portion 14. The conductive traces 32 and 33 and the conductive pads 34 and permit securing and interconnection of electronic components to the circuit board 10. For example, electronic components 36 are shown secured to the first portion 12 and the second portion 14. It will of course be appreciated that numerous electronic components will typically be secured to the circuit board 10.

A plurality of connecting traces 38 are formed on the bend region 16 of the substrate 11. The connecting traces 38 couple the conductive traces 32 on the first portion 12 with the conductive traces 33 formed on the second portion 14. Advantageously, in accordance with a preferred embodiment of the invention, the conductive traces 32 and 33 and the connecting traces 38 may be formed and covered with rigid solder mask. That is, solder mask having an elongation of less than 10 percent. Previous flexible circuits required the use of flexible solder mask, i.e., solder mask having an elongation up to 30 percent to account for the tensile stress introduced in flexing the circuit board. Flexible solder mask is substantially more expensive than rigid solder mask.

Figure 4:
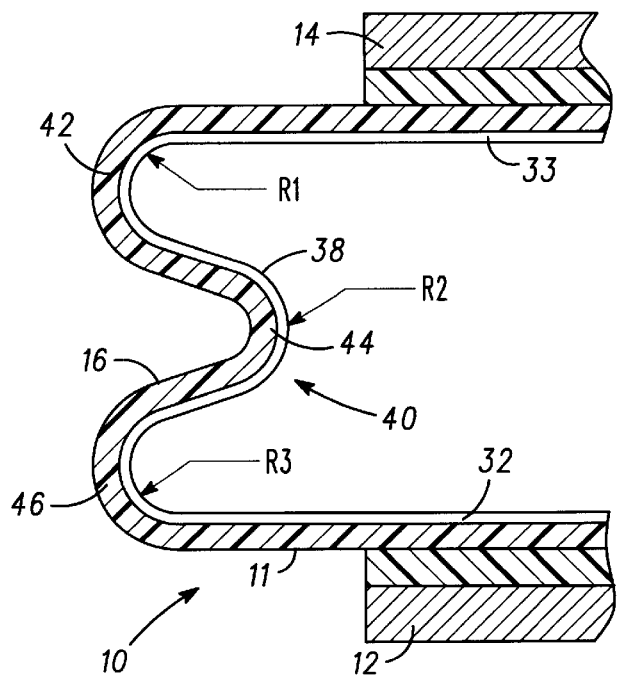
FIG. 4 is an enlarged view of a portion of the flexible circuit board shown in FIG. 3.

Referring to FIG. 3 and FIG. 4, in forming the housing structure 30 by bending the first housing member 18 with respect to the second housing member 20, within the housing structure 30, a bend 40 is formed in the bend region 16 of the substrate 11. This is a free-bend as the bend region 16 is unsupported during the bending process. Three radii, 42, 44 and 46 may be formed in the bend region 16, and each has a radius, R1, R2 and R3, respectively. Radii R1, R2 and R3 are each less than approximately 120 mils, and may be between about 40 mils and 100 mils. To accomplish formation of the bend 40 without causing cracking or otherwise damaging the FR4 material forming the bend region 16 and/or the connecting traces 38, the substrate 11 is first heated to within about 10° C. of the glass transition temperature, $T_g$, of the FR4 material.

For example, for an FR4 material having a $T_g$ of 150° C., the substrate 11 may be heated to between about 150–160° C., and preferably to about 155° C. prior to bending. The FR4 becomes sufficiently flexible under heating to permit the formation of the bend 40 without causing damage to the substrate 11 or the circuit components 36. Furthermore, and as noted above, this heating of the substrate 11 has the further advantage of permitting the use of rigid solder mask in the formation of the conductive traces 32 and 33 and the connecting traces 38. The $T_g$ for rigid solder mask is typically less that the $T_g$ of FR4. By heating the substrate 11 to within about 10° C. of the $T_g$ of the substrate material, the rigid solder mask becomes sufficiently flexible to permit flexing in the region of the bend 40 without the formation of tensile stress that would otherwise be observed in the bend 40, and particularly within radius 44 that may cause cracking or separation of the connecting traces 38.

Achieving radii, such as radii 42–46, within the bend 40 allows the circuit board 10 to be more compactly folded than could otherwise be accomplished using FR4 or similar relatively brittle materials. The alternative is to use polyimide or similar flexible materials at a substantial cost penalty. The compactly folded circuit board 10 allows the housing structure 30 to have a compact profile. The compact profile of the housing structure 30 facilitates installation within, for example, a motor vehicle, an aircraft or an industrial application. In addition, bend 40 substantially retains its shape and experiences very little spring back, suggesting little or no stress in the bend region 16. In contrast, polyimide material after bending tends to return to its pre-bent shape.

Figure 5:
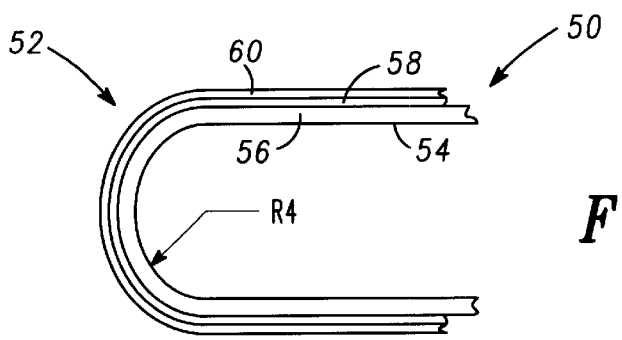
FIG. 5 is an enlarged view of a portion of a flexible circuit board in accordance with an alternate preferred embodiment of the invention.

Referring now to FIG. 5, a circuit board 50 is formed to include a bend 52 having a radius R4 of about 40–60 mils. The bend 52 may be free formed or mandrel formed. The circuit board 50 includes a substrate 54, formed from a plurality of layers (three layers 56, 58 and 60 being shown) of FR4 material. The substrate 54 in the region of the bend will preferably be a single layer of the FR4 material. In accordance with a preferred embodiment of the invention, prior to formation of the bend 52, the substrate 54 is heated to within about 10° C. of the Tg of the substrate material. Use of a mandrel in conjunction with the heating of the substrate 54, may permit forming bend 52 with yet a smaller radius than may be accomplished by free bending after heating.

Figure 6:
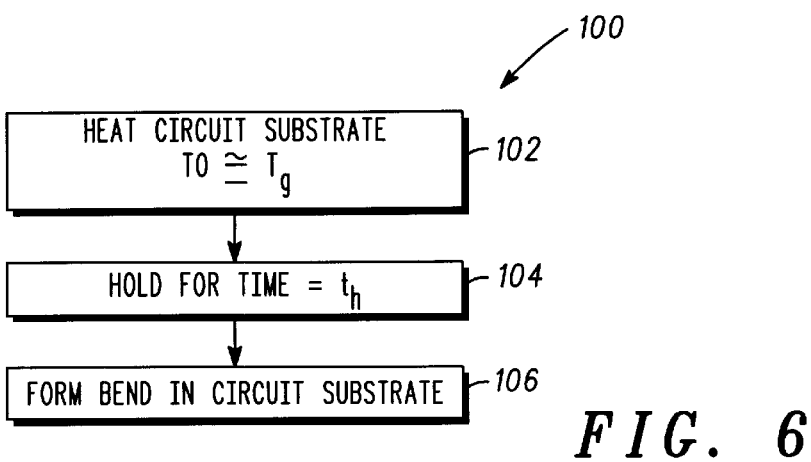
FIG. 6 is a flow chart illustrating a method for making a flexible circuit board/in accordance with a preferred embodiment of the present invention.

Referring to FIG. 6, a method 100 in accordance with a preferred embodiment of the invention for forming a flexible circuit board is shown in flowchart form. At step 102, a circuit substrate formed of a relatively brittle material, such as substrate 11 or substrate 54, is heated to approximately the $T_g$ of the substrate material. In an automated manufacturing process, prior to heating the circuit substrate may be formed with conductive traces, conductive pads and have electrical components secured to and electrically coupled to the conductive traces and conductive pads. This may be accomplished using well known manufacturing and soldering techniques. The heating step may be part of this overall assembly process, and may encompass passing the circuit substrate through an oven.

At step 104, the substrate is held for a short time interval, $t_h$, at or near the transition temperature, $T_g$, of the substrate material. The time interval, t, may be approximately 5–15 seconds, and preferably about 10 seconds. At step 104, a bend, such as the bend 40 or the bend 52, is formed in the substrate. The bend may be a free bend or mandrel formed. In addition, prior to bending and as part of the overall circuit manufacturing process, the circuit substrate may have been secured within an open housing, and the housing may be bent with circuit substrate to form the finished electronic device.

In accordance with a preferred embodiment of the invention, the bend may have a radius less than 120 mils, and may have radius between about 40–100 mils. Subsequent to forming the bend no further processing is required.

Many additional changes and modifications could be made to the invention without departing from the fair scope and spirit thereof. The scope of some changes is discussed above. The scope of others will become apparent from the appended claims.

We claim:

1. A flexible circuit board comprising:
    a single layer of substantially rigid circuit substrate material, the layer having a first portion and a second portion separated by a bend region, each of the first portion and the second portion being formed with conductive traces and conductive pads for securing and interconnecting electrical components thereto and connecting conductive traces formed between the first portion and the second portion, the connecting conductive traces extending through the bend region;

the first portion being folded relative to the second portion forming at least one bend in the bend region, the at least one bend having a radius less than 120 mils; and the first portion being folded relative to the second portion farther forming at least a second bend in the bend region, the at least a second bend having a radius less than 120 mils.

2. The flexible circuit board as set forth in claim 1, wherein the first portion and the second portion are sized to be received in a first housing member and a second housing member, respectively.

3. The flexible circuit board as set forth in claim 1, wherein the substantially rigid substrate material comprises a layer of glass weave impregnated with epoxy resin.

4. A flexible circuit board comprising;

a substrate having a layer of glass weave impregnated with epoxy resin, the substrate having a first portion and a second portion separated by a bend region, each of the first portion and the second portion being formed with conductive pads and conductive traces for securing and interconnecting electrical components thereto and connecting conductive traces formed between the first portion and the second portion, the connecting conductive traces extending through the bend region;

the first portion being folded relative to the second portion forming at least one bend in the bend region, the at least one bend having a radius less than 120 mils; and the first portion being folded relative to the second portion further forming at least a second bend in the bend region, the at least a second bend having a radius less than 120 mils.

5. The flexible circuit board as set forth in claim 4, wherein the layer comprises a single glass weave.

6. A method for forming a circuit board, the method comprising the steps of:

providing a substrate, the substrate comprising a bend region, the bend region being a single planar layer of substantially rigid material;

heating the substrate; and forming a bend in the substrate at the bend region, wherein the step of forming a bend comprises forming at least a first bend and a second bend, each of the first bend and the second bend having a radius less than 120 mils.

7. The method as set forth in claim 6, wherein the step of forming a bend comprises mandrel bending the substrate to form the radius.

8. The method as set forth in clam 6, further comprising, before the step of heating, the step of providing a plurality of conductive traces and conductive pads on the substrate.

9. A flexible circuit board comprising:

a single layer of substantially rigid circuit substrate material, the layer having a first portion and a second portion separated by a bend region, each of the first portion and the second portion being formed with conductive traces and conductive pads for securing and interconnecting electrical components thereto and connecting conductive traces formed between the first portion and the second portion, the connecting conductive traces extending through the bend region;

the first portion being folded relative to the second portion forming at least one bend in the bend region, the at least one bend having a radius less than 120 mils; and wherein the connecting traces comprise a solder mask having an elongation characteristic of less than 10 percent.

10. The flexible circuit board as set forth in claim 9, wherein the layer has a structure that is substantially uniform throughout the first portion, the second portion and the bend region.

11. The flexible circuit board as set forth in claim 9, wherein the first portion and the second portion each comprises at least one additional lamination of circuit substrate material.

12. A flexible circuit board comprising:

a substrate having a layer of glass weave impregnated with epoxy resin, the substrate having a first portion and a second portion separated by a bend region, each of the first portion and the second portion being formed with conductive pads and conductive traces for securing and interconnecting electrical components thereto and connecting conductive traces formed between the first portion and the second portion, the connecting conductive traces extending through the bend region;

the first portion being folded relative to the second portion forming at least one bend in the bend region, the at least one bend having a radius less than 120 mils; and wherein the connecting traces comprise a solder mask having an elongation characteristic of less than 10 percent.

13. A method for forming a circuit board, the method comprising the steps of:

providing a substrate, the substrate comprising a bend region, the bend region being a single planar layer of substantially rigid material;

providing a plurality of conductive traces and conductive pads on the substrate using a solder mask having an elongation characteristic of less than 10 percent;

heating the substrate; and forming a bend in the substrate at the bend region.

14. The method as set forth in claim 13, further comprising, before the step of heating, the step of securing a first portion of the substrate within a first housing member and a second portion of the substrate within a second housing member, wherein the first portion and the second portion are coupled by the bend region, and wherein the step of forming a bend comprises the step of forming a bend in the bend region.

15. The method as set forth in claim 13, further comprising, before the step of forming a bend, the step of holding for a predetermined hold period.

16. The method as set forth in claim 13, wherein the step of heating comprises heating the substrate to approximately the glass transition temperature of the substrate material.

17. The method as set forth in claim 13, wherein the substantially rigid substrate material comprises a layer of glass weave impregnated with epoxy resin.

* * * * *

UNITED STATES PATENT AND TRADEMARK OFFICE
CERTIFICATE OF CORRECTION

PATENT NO.    : 6,292,370 B1
DATED         : September 18, 2001
INVENTOR(S)   : Anderson et al.

It is certified that error appears in the above-identified patent and that said Letters Patent is hereby corrected as shown below:

Column 5,
Line 9, reads "farther", should be -- further --

Signed and Sealed this

Twelfth Day of March, 2002

Attest:

Attesting Officer

JAMES E. ROGAN
Director of the United States Patent and Trademark Office